US008283671B2

(12) United States Patent
Kim et al.

(10) Patent No.: US 8,283,671 B2
(45) Date of Patent: Oct. 9, 2012

(54) THIN FILM TRANSISTOR, METHOD OF FABRICATING THE SAME, AND ORGANIC LIGHT EMITTING DIODE DISPLAY DEVICE INCLUDING THE SAME

(75) Inventors: Eun-Hyun Kim, Yongin (KR); Jae-Seob Lee, Yongin (KR); Dong-Un Jin, Yongin (KR)

(73) Assignee: Samsung Mobile Display Co., Ltd., Nongseo-Dong, Giheung-Gu, Yongin, Gyunngi-Do (KR)

( * ) Notice: Subject to any disclaimer, the term of this patent is extended or adjusted under 35 U.S.C. 154(b) by 181 days.

(21) Appl. No.: 12/453,724

(22) Filed: May 20, 2009

(65) Prior Publication Data
US 2009/0289258 A1    Nov. 26, 2009

(30) Foreign Application Priority Data
May 26, 2008   (KR) .................... 10-2008-0048737

(51) Int. Cl.
*H01L 27/14*   (2006.01)
*H01L 29/04*   (2006.01)
*H01L 29/15*   (2006.01)
*H01L 31/036*   (2006.01)

(52) U.S. Cl. ............... 257/72; 257/59; 257/66; 257/67; 257/68; 257/69; 257/70; 257/71; 438/166

(58) Field of Classification Search ............ 257/59, 257/72, 66–71; 438/166
See application file for complete search history.

(56) References Cited

U.S. PATENT DOCUMENTS

| 6,207,971 | B1 * | 3/2001 | Jinno et al. | 257/72 |
| 6,605,496 | B1 * | 8/2003 | Yamazaki | 438/166 |
| 7,033,872 | B2 * | 4/2006 | Jinno et al. | 438/166 |
| 2004/0232420 | A1 * | 11/2004 | Lee et al. | 257/59 |

(Continued)

FOREIGN PATENT DOCUMENTS
JP    08062628 A    3/1996
(Continued)

OTHER PUBLICATIONS

Korean Office Action issued by Korean Patent Office on Apr. 29, 2010 corresponding Korean Patent Application No. 10-2008-0048737 and Request for Entry of the Accompanying Office Action attached herewith.

*Primary Examiner* — Kimberly Rizkallah
*Assistant Examiner* — Errol Fernandes
(74) *Attorney, Agent, or Firm* — Robert E. Bushnell, Esq.

(57) ABSTRACT

A thin film transistor, a method of fabricating the same, and an organic light emitting diode display device including the same, which allow a size of a grain of a channel region to be increased, can effectively protect the channel region of a semiconductor layer at the time of etching process, and can reduce processing cost. The thin film transistor includes a substrate, a gate electrode disposed on the substrate, a gate insulating layer disposed on the gate electrode, a semiconductor layer pattern disposed on the gate insulating layer and including a channel region, a source region and a drain region, an etch stop layer pattern disposed on the channel region of the semiconductor layer pattern and having a thickness of 20 to 60 nm, and source and drain electrodes disposed on the source and drain regions of the semiconductor layer pattern, respectively.

17 Claims, 7 Drawing Sheets

U.S. PATENT DOCUMENTS

2004/0266080 A1 * 12/2004 Jyumonji et al. ............ 438/166

FOREIGN PATENT DOCUMENTS

| | | |
|---|---|---|
| JP | 09139506 A | 5/1997 |
| JP | 10326748 A * | 12/1998 |
| JP | 11074535 A | 3/1999 |
| JP | 2003186421 A | 7/2003 |
| JP | 2005064487 A | 3/2005 |
| JP | 2005136138 A | 5/2005 |
| JP | 2005-322898 | 11/2005 |
| JP | 2006-019527 | 1/2006 |
| JP | 2006-310445 | 11/2006 |
| JP | 2008085091 A | 4/2008 |
| KR | 10-2005-0042596 | 5/2005 |
| KR | 10-2006-0008521 | 1/2006 |
| KR | 1020060060937 A | 6/2006 |
| KR | 10-2007-0109873 A | 11/2007 |
| KR | 10-2008-0010781 A | 1/2008 |

* cited by examiner $T_n$; NUCLEATION TEMPERATURE
$T_{pm}$; PARTIAL MELTING TEMPERATURE
$T_{cm}$; COMPLETE MELTING TEMPERATURE

THIN FILM TRANSISTOR, METHOD OF FABRICATING THE SAME, AND ORGANIC LIGHT EMITTING DIODE DISPLAY DEVICE INCLUDING THE SAME

CLAIM FOR PRIORITY

This application makes reference to, incorporates the same herein, and claims all benefits accruing under 35 U.S.C. §119 from an application for THIN FILM TRANSISTOR, METHOD OF FABRICATING THE SAME, AND ORGANIC LIGHT EMITTING DIODE DISPLAY DEVICE INCLUDING THE SAME earlier filed in the Korean Intellectual Property Office as Korean Patent Application No. 2008-48737, filed May 26, 2008.

BACKGROUND OF THE INVENTION

1. Field of the Invention

The present invention relates to a thin film transistor (TFT), a method of fabricating the same, and an organic light emitting diode (OLED) display device including the same, and more particularly, to a thin film transistor (TFT), a method of fabricating the same, and an OLED display device including the same, which can increase the size of a grain in a channel region, effectively protect the channel region of a semiconductor layer at the time of etching process, and reduce processing cost by forming an etch stop layer pattern and crystallizing an amorphous silicon layer using a laser.

2. Description of the Related Art

In general, a polycrystalline silicon layer advantageously has high field effect mobility, can be applied to a high-speed operating circuit, and can be used for configuring a complementary metal oxide semiconductor (CMOS), so that it is usually employed for forming a semiconductor layer of a thin film transistor (TFT). Such a thin film transistor (TFT) using the polycrystalline silicon layer is usually employed for active devices of an active matrix liquid crystal display (AM-LCD) and switching devices and drive devices of an active matrix organic light emitting diode (AMOLED).

The thin film transistor (TFT) used for the display device may be classified as either a top-gate type thin film transistor (TFT) or a bottom-gate type thin film transistor (TFT). In the bottom-gate type thin film transistor (TFT), a doped amorphous silicon layer or source and drain electrodes, etc. are formed directly on a semiconductor layer, however, the semiconductor layer may be damaged by an etch margin at the time of etching the doped amorphous silicon layer or the source and drain electrodes, so that the semiconductor layer should be thick. However, when the semiconductor layer becomes thicker, not only its production cost increases but a gate leakage occurs due to the thicker semiconductor layer.

In order to cope with such drawbacks, an etch stop layer pattern may be formed on a region of the semiconductor layer where a channel region is formed. When the etch stop layer pattern is employed, the etch stop layer is usually patterned after the semiconductor layer pattern is formed. In this case, the etch stop layer pattern causes the number of masking processes to be increased by one compared to the conventional process.

In addition, the polycrystalline silicon layer used for forming the semiconductor layer of the bottom-gate type thin film transistor (TFT) may be formed by irradiating an excimer (or exciplex) laser on an amorphous silicon layer to crystallize the amorphous silicon layer. At this time, the excimer laser is irradiated on the amorphous silicon layer to perform crystallization before the etch stop layer pattern is formed. However, it is difficult to maintain a high temperature enough to form a great grain while the amorphous silicon layer is crystallized. In addition, the excimer laser uses a gas source, which makes it difficult to ensure uniformity for every process and requires high costs in equipment management and source to be used.

SUMMARY OF THE INVENTION

Aspects of the present invention provides a thin film transistor (TFT), a method of fabricating the same, and an organic light emitting diode (OLED) display device including the same which can increase the size of a grain in a channel region, effectively protect the channel region of a semiconductor layer at the time of etching process, and reduce processing cost by forming an etch stop layer pattern and crystallizing an amorphous silicon layer using a continuous-wave solid-state laser.

According to an embodiment of the present invention, a thin film transistor (TFT) includes: a substrate; a gate electrode disposed on the substrate; a gate insulating layer disposed on the gate electrode; a semiconductor layer pattern disposed on the gate insulating layer and including a channel region, a source region and a drain region; an etch stop layer pattern disposed on the channel region of the semiconductor layer pattern and having a thickness of 20 to 60 nm; and source and drain electrodes disposed on the source and drain regions of the semiconductor layer pattern, respectively.

According to another embodiment of the present invention, a method of fabricating a thin film transistor (TFT) includes: preparing a substrate; forming a gate electrode on the substrate; forming a gate insulating layer on the gate electrode; forming an amorphous silicon layer on the gate insulating layer; forming an etch stop layer pattern to a thickness of 20 to 60 nm in a predetermined region of the amorphous silicon layer; irradiating a laser on the entire surface of the substrate to crystallize the amorphous silicon layer into a polycrystalline silicon layer; forming a metal layer for source and drain electrodes on the entire surface of the substrate where the etch stop layer pattern is formed; and patterning the polycrystalline silicon layer and the metal layer for source and drain electrodes.

According to still another embodiment of the present invention, an organic light emitting diode (OLED) display device includes: a substrate; a gate electrode disposed on the substrate; a gate insulating layer disposed on the gate electrode; a semiconductor layer pattern disposed on the gate insulating layer and including a channel region, a source region and a drain region; an etch stop layer pattern disposed on the channel region of the semiconductor layer pattern and having a thickness of 20 to 60 nm; source and drain electrodes disposed on the source and drain regions of the semiconductor layer pattern; a first electrode electrically connected to one of the source and drain electrodes; an organic layer disposed on the first electrode and including an emission layer; and a second electrode disposed on the organic layer.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
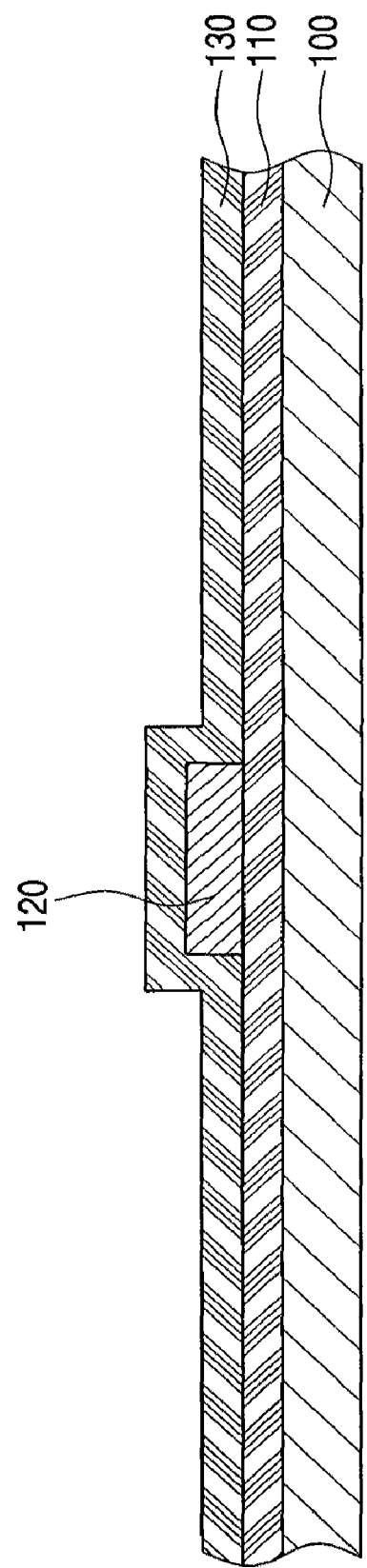
FIGS. 1A to 1D are cross-sectional views illustrating a process of fabricating a thin film transistor (TFT) according to an embodiment of the present invention.

Reference will now be made in detail to the present embodiments of the present invention, examples of which are shown in the accompanying drawings, wherein like reference numerals refer to the like elements throughout the specification. The embodiments are described below in order to explain the present invention by referring to the figures.

FIGS. 1A to 1D are cross-sectional views of a process of fabricating a thin film transistor (TFT) according to an embodiment of the present invention.

A buffer layer 110 is first formed on a substrate 100 such as glass or plastic as shown in FIG. 1A. The buffer layer 110 may be formed of an insulating layer such as a silicon oxide layer or a silicon nitride layer, or a stacked layer thereof using a chemical vapor deposition (CVD) method or a physical vapor deposition (PVD) method. At this time, the buffer layer 110 acts to prevent moisture or impurities generated in the substrate 100 from diffusing or facilitate crystallization of an amorphous silicon layer by adjusting a heat transfer rate.

A metal layer (not shown) for a gate electrode is formed on the buffer layer 110. The metal layer may be a single layer formed of aluminum (Al) or an Al alloy such as Al—Nd, or a multilayer in which an Al alloy is stacked on a Cr or Mo alloy. The metal layer is etched by a photolithography process to form gate electrode 120 at a portion corresponding to a channel region of a semiconductor layer to be subsequently formed.

A gate insulating layer 130 is formed on the gate electrode 120. Here, the gate insulating layer 130 may be a silicon oxide layer, a silicon nitride layer or a combination thereof.

Figure 1B:
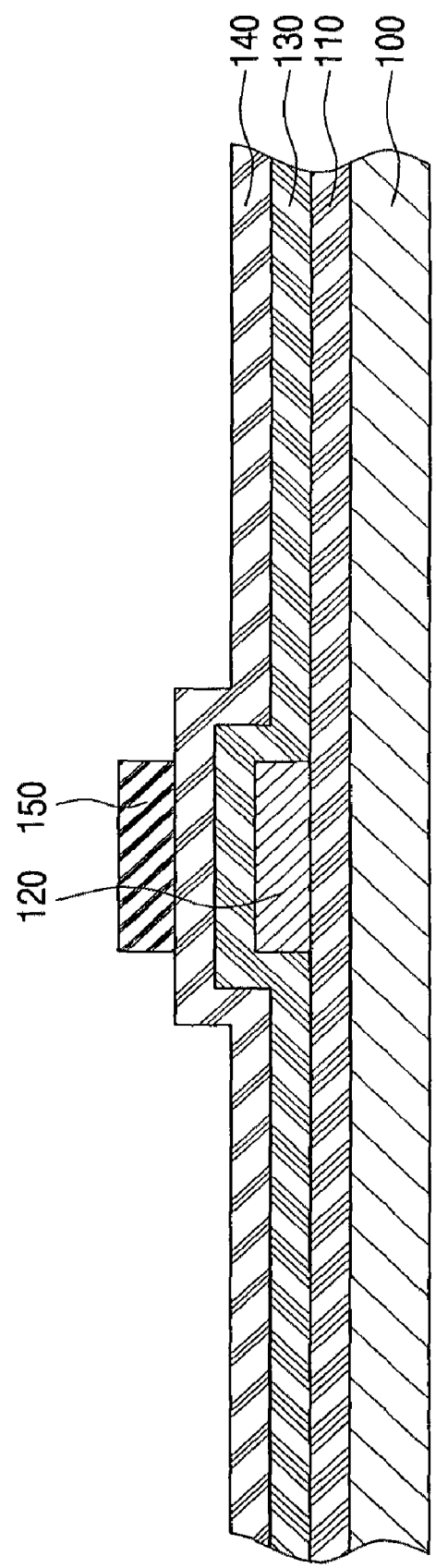

Referring to FIG. 1B, an amorphous silicon layer 140 is formed on the gate insulating layer 130. At this time, the amorphous silicon layer 140 may be formed by a CVD method or a PVD method.

An etch stop layer pattern 150 is then formed on the amorphous silicon layer 140. The etch stop layer pattern 150 has a thickness of 20 to 60 nm. The etch stop layer pattern 150 may be formed of a silicon oxide layer or a silicon nitride layer, and may also be formed by depositing the silicon oxide layer or the silicon nitride layer and etching the silicon oxide layer or the silicon nitride layer using a photolithography process. The etch stop layer pattern 150 is formed to correspond to the channel region of the semiconductor layer.

Figure 1C:
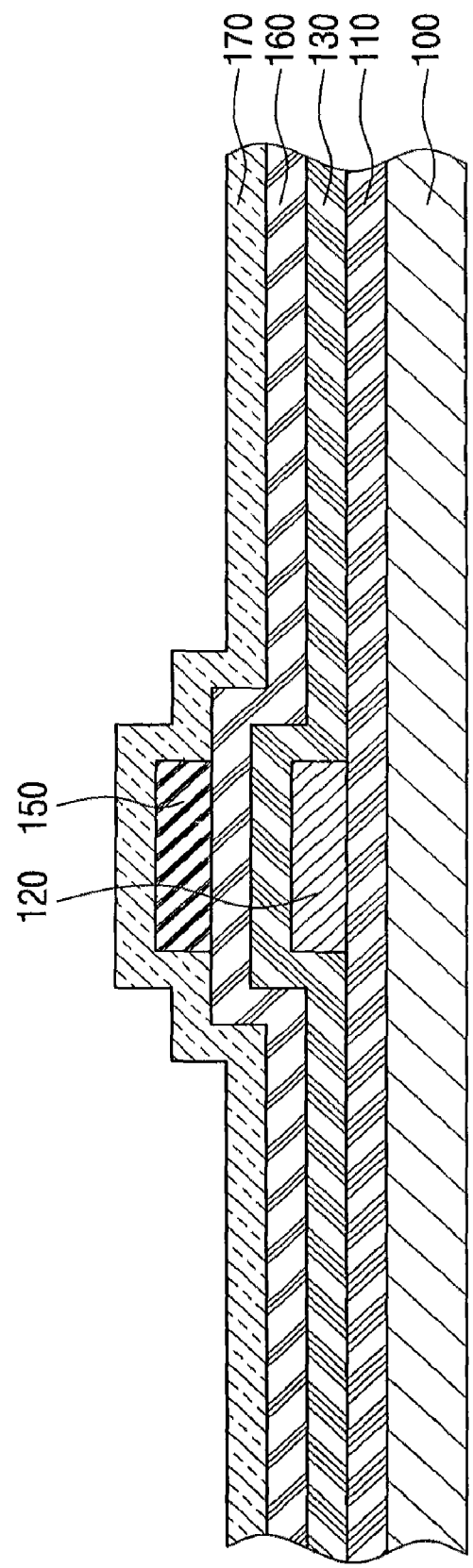

A laser is then irradiated on the amorphous silicon layer 140 to crystallize the amorphous silicon layer 140 into a polycrystalline silicon layer (160 of FIG. 1C). The laser is preferably a continuous-wave solid-state laser. The excimer laser uses a gas source, so that it may be difficult to secure uniformity for every process and may require high costs in equipment management and source to be used. In contrast, in the case of a continuous-wave solid-state laser, the source to be used is a solid so that it can be used semi-permanently, and costs much less in the equipment management and the source to be used in comparison with the excimer laser. In addition, the continuous-wave solid-state laser has a higher energy than the excimer laser, so that the size of a grain of the polycrystalline silicon layer crystallized by the continuous-wave solid-state laser is greater. When the continuous-wave solid-state laser is employed, it is advantageous to grow the grain in an irradiation direction of the laser. Therefore, when the continuous-wave solid-state laser is irradiated, it is preferable to irradiate the laser in a direction where a channel of a semiconductor layer is formed, that is, a direction parallel to a line connecting a source region and a drain region of the semiconductor layer.

The continuous-wave solid-state laser may use Nd:YVO$_4$ (Yttrium Vanadate) as a solid source, and may be a green laser having a wavelength of 500 to 550 nm. The continuous-wave solid-state laser may be irradiated at an irradiation speed of 100 to 300 mm/s with an output of 7 to 10 W.

Figure 1D:
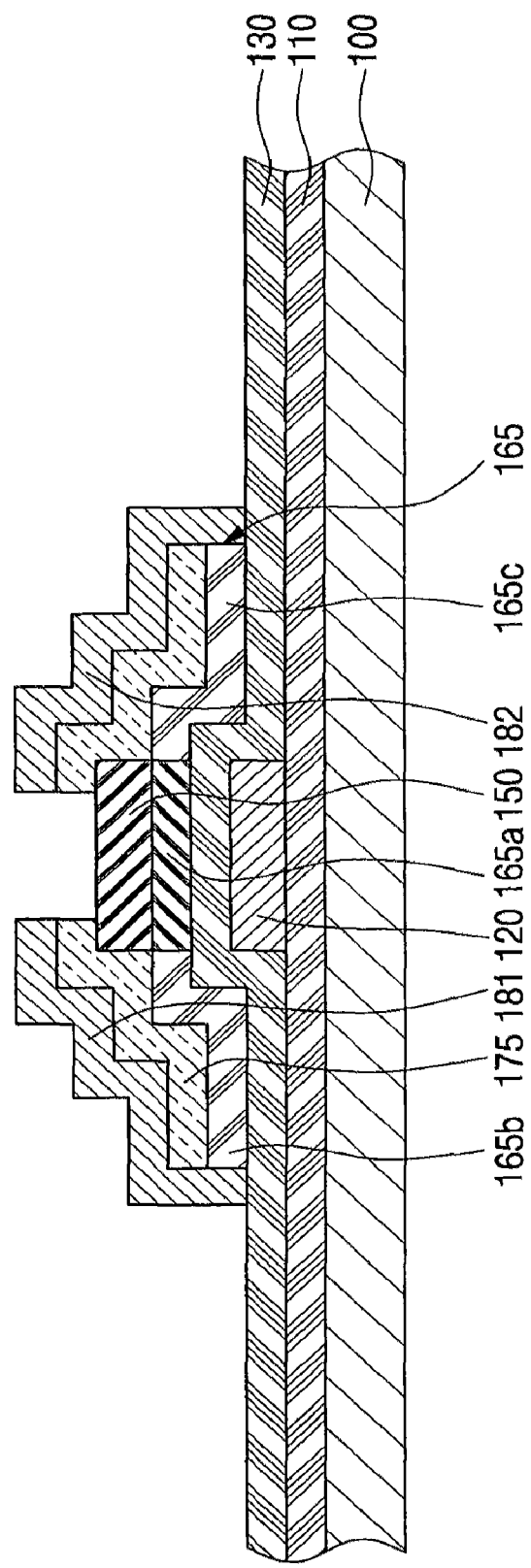

FIGS. 1C and 1D will be discussed later.

Figure 2:
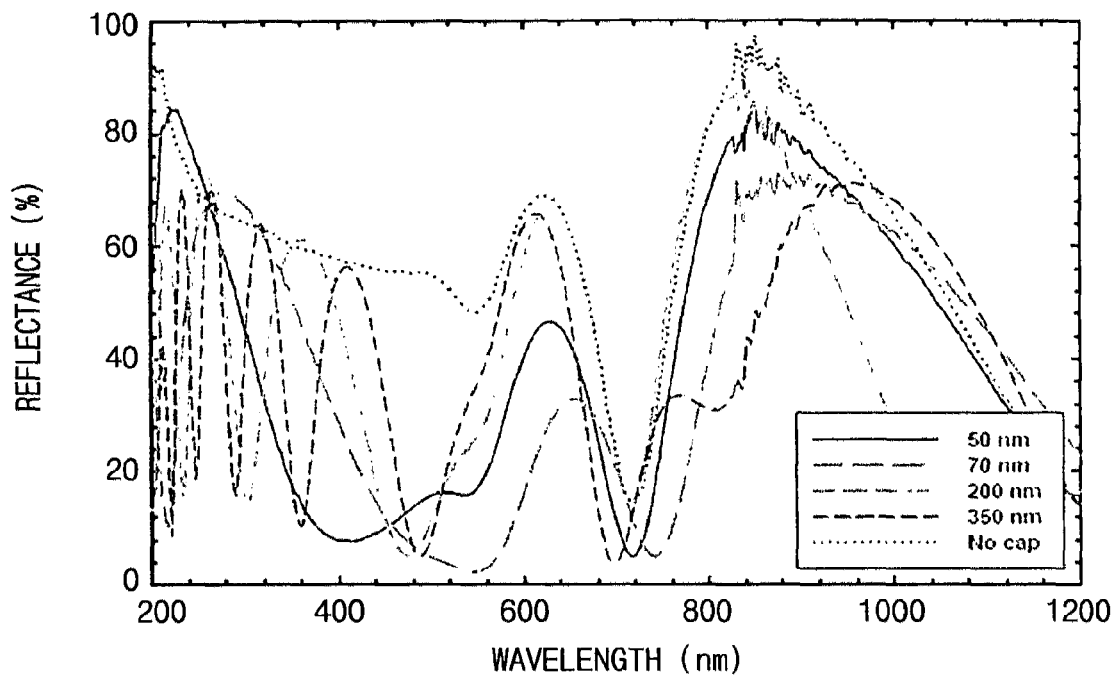
FIG. 2 is a graph of reflectance (%) of an etch stop layer pattern versus wavelength (nm) of a laser when the etch stop layer pattern is not formed and when the etch stop layer pattern is formed to a thickness of each of 50, 70, 200, and 350 nm.

FIG. 2 is a graph of reflectance (%) of the etch stop layer pattern 150 versus wavelength (nm) of a laser when the etch stop layer pattern 150 is not formed and when the etch stop layer pattern 150 is formed to a thickness of each of 50, 70, 200, and 350 nm. The graph is associated with the etch stop layer pattern formed of a silicon nitride layer, however, exhibits a similar tendency even if it is formed of a silicon oxide layer.

Referring to FIG. 2, it can be found that the reflectance (%) is the lowest when the thickness of the etch stop layer pattern 150 is 70 nm in a laser wavelength range of 500 to 550 nm. That is, it can be seen that the lowest thickness for the lowest reflectance is 70 nm.

Based on the results mentioned above, when the etch stop layer pattern 150 is not formed, and when the etch stop layer pattern 150 is formed to a thickness of each of 50, 70, 200 and 350 and the continuous-wave solid-state laser is irradiated on the amorphous silicon layer 140 to perform crystallization, the size of a grain in the crystallized polycrystalline silicon layer tends to be inversely proportional to the reflectance. That is, the etch stop layer pattern 150 contains much heat irradiated from the laser to cause the size of the grain of the polycrystalline silicon layer disposed below the pattern to be increased when the reflectance is low, and contains less heat irradiated from the laser to cause the size of the grain of the polycrystalline silicon layer disposed below the pattern to be decreased when the reflectance is high.

However, when the thickness is 70 nm, the reflectance becomes lowest, but the amorphous silicon layer 140 absorbs too much laser energy to be damaged. Therefore, the preferable thickness of the etch stop layer pattern 150 is a thickness having a proper reflectance that does not damage the amorphous silicon layer 140, for example, a thickness having a reflectance of about 5 to 20%. In addition, a minimum range of the thickness is 20 to 60 nm even in the range of the reflectance.

According to the present invention, after the etch stop layer pattern 150 is formed, the laser is irradiated on the amorphous silicon layer 140 to crystallize the amorphous silicon layer 140 into a polycrystalline silicon layer (160 of FIG. 1C).

Figure 3:
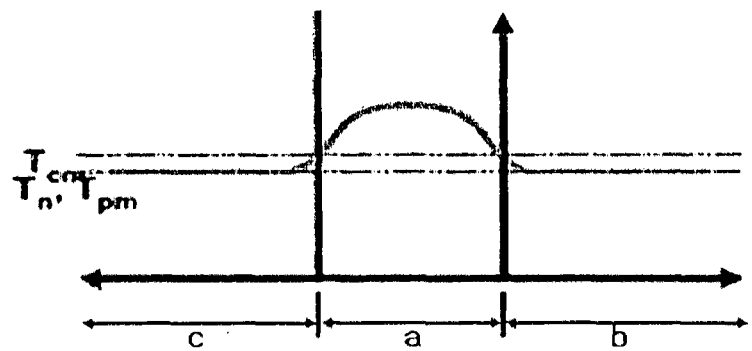
FIG. 3 is a graph illustrating a temperature distribution within an amorphous silicon layer in a region where an etch stop layer pattern is not formed and in a region where the etch stop layer pattern is formed when a laser is irradiated on the amorphous silicon layer.

FIG. 3 is a graph illustrating a temperature distribution within the amorphous silicon layer 140 in regions (b) and (c) where the etch stop layer pattern 150 is not formed and in a region (a) where the etch stop layer pattern 150 is formed when a laser is irradiated on the amorphous silicon layer 140.

Referring to FIG. 3, the amorphous silicon layer 140 reaches a temperature at which partial melting occurs in the regions (b) and (c) where the etch stop layer pattern 150 is not formed, that is, a region corresponding to source and drain regions of a semiconductor layer pattern. The polycrystalline silicon layer crystallized at this temperature has a grain of 0.5 to 2 µm.

In contrast, the etch stop layer 150 acts to contain heat irradiated from the laser in the region (a) where the etch stop layer pattern 150 is formed, that is, a region corresponding to a channel region of the semiconductor layer pattern, so that the amorphous silicon layer 140 can reach a temperature higher than the temperature where complete melting occurs corresponding to a region is where the etch stop layer pattern 150 is not formed. The size of the grain of the polycrystalline silicon layer crystallized at the temperature may be 1 to 10 µm, that is, at least two times the size of the grain in the regions (b) and (c). At this time, the size of the grain may be different depending on the thickness of the etch stop layer pattern 150. For example, the grain size may be equal to or higher than 1 µm and less than 5 µm when the etch stop layer pattern 150 has a thickness equal to or higher than 20 nm and less than 40 nm, and may be 5 to 10 µm when the etch stop layer pattern 150 has a thickness of 40 to 60 nm.

When the grain size is 5 to 10 µm, it is a large enough size to form the channel region in one grain. That is, the channel region may be formed without a grain boundary in the channel region. Therefore, it is preferable to form the etch stop layer pattern 150 to a thickness of 40 to 60 nm, since it enhances the property of the thin film transistor (TFT).

Figure 4A:
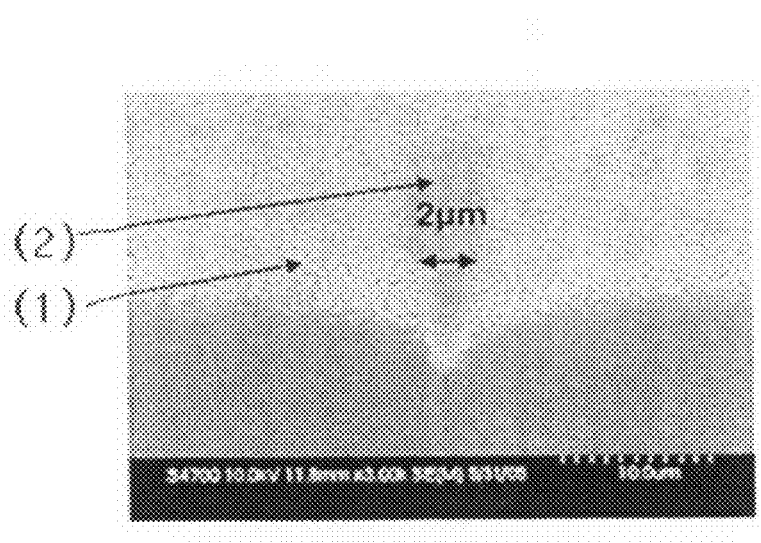
FIGS. 4A and 4B illustrate scanning electron microscope (SEM) images of a polycrystalline silicon layer formed in accordance with an exemplary embodiment of the present invention.

FIG. 4A illustrate scanning electron microscope (SEM) images of a polycrystalline silicon layer formed in accordance with an exemplary embodiment of the present invention. The laser was a continuous-wave solid-state green laser having a wavelength of 532 nm and using a solid source of Nd:YVO$_4$, an output was 7.5 W, an irradiation speed was 100 mm/s, and an irradiation direction was from right to left.

FIG. 4A corresponds to a case when the etch stop layer pattern 150 has a thickness of 30 nm. It can be found that the grain size is about 0.5 µm in a region (1) where the etch stop layer pattern 150 is not formed above the amorphous silicon layer 140 whereas the grain size is 2 µm in a region (2) where the etch stop layer pattern 150 is formed above the amorphous silicon layer 140.

Figure 4B:
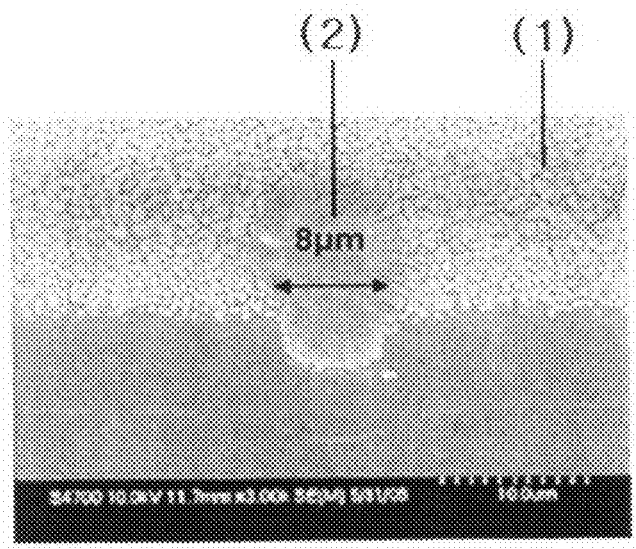

In addition, FIG. 4B corresponds to a case when the etch stop layer pattern 150 has a thickness of 50 nm. It can be found that the grain size is about 0.5 µm in the region (1) where the etch is stop layer pattern 150 is not formed above the amorphous silicon layer 140 whereas the grain size is 8 µm in the region (2) where the etch stop layer pattern 150 is formed above the amorphous silicon layer 140.

In addition, referring to FIGS. 4A and 4B, it can be found that the grain grows in a direction from right to left, which is the same direction as the irradiation direction of the laser, in the region 2 where the etch stop layer pattern 150 is formed.

In addition, the laser is irradiated on the amorphous silicon layer 140 to crystallize the amorphous silicon layer 140 after the etch stop layer pattern 150 is formed in the present invention, so that the laser is also irradiated on the etch stop layer pattern 150. When the laser is irradiated on the etch stop layer pattern 150, an entire portion of the etch stop layer pattern 150 is cured to have a property that etching hardly occurs at the time of dry etching using plasma or wet etching using an etchant in a subsequent etching process (for example, the etch stop layer pattern before the laser is irradiated has an etch selectivity of 200 nm/minute) with respect to an etching solution in which NH$_4$F and HF are mixed at a ratio of 6:1, however, has a very low etch selectivity of 0 to 1 nm/minute with respect to the etching solution after the laser is irradiated on the etch stop layer pattern. Therefore, when the laser is irradiated after the etch stop layer pattern 150 is formed, the etch stop layer pattern 150 can have the changed property that hardly allows etching to occur to thereby effectively protect the semiconductor layer in a subsequent etching process.

Referring to FIG. 1C, an amorphous silicon layer 170 doped with n or p-type impurities may be formed on the entire surface of the substrate 100 where the etch stop layer pattern 150 is formed. At this time, phosphorus (P) and boron (B) are preferably used as the n-type and p-type impurities, respectively.

Referring to FIG. 1D, the polycrystalline silicon layer 160 and the doped amorphous silicon layer 170 are patterned to form the polycrystalline silicon layer 160 as a semiconductor layer pattern 165, and the doped amorphous silicon layer 170 is formed as an amorphous silicon layer pattern 175 doped with n or p-type impurities. According to the present invention, the polycrystalline silicon layer 160 and the doped amorphous silicon layer 170 are patterned using one mask, so that the number of masking processes can be reduced by one compared to the conventional process of individually patterning the polycrystalline silicon layer 160 and the doped amorphous silicon layer 170, so that the number of masking processes is not increased in comparison with the case of not forming the etch stop layer pattern 150 even if the etch stop layer pattern 150 is formed.

According to FIGS. 3 and 4 and the associated description, the grain size is 0.5 to 2 µm in a region corresponding to the regions where the etch stop layer pattern 150 is not formed within the semiconductor layer pattern 165, i.e., source and drain regions 165b and 165c, and the grain size is 1 to 10 µm in a region corresponding to the region where the etch stop layer pattern 150 is formed, i.e., a channel region 165a.

When the etch stop layer pattern 150 has a thickness of 40 to 60 nm, the grain size of the channel region 165a may be 5 to 10 µm. At this time, the grain boundary may not be present within the channel region 165a. In addition, it is preferable to irradiate the laser to allow the grain to grow in the channel region 165a in a direction parallel to a line connecting the source region 165b and the drain region 165c.

A metal layer for source and drain electrodes to be connected to the source and drain regions 165b and 165c is then formed on the doped amorphous silicon layer pattern 175, which is then patterned by a photolithography process to form source and drain electrodes 181 and 182 electrically connected to the source and drain regions 165b and 165c of the semiconductor layer pattern 165. The source and drain electrodes 181 and 182 may be formed of one selected from the group consisting of Mo, Cr, W, MoW, Al, Al—Nd, Ti, TiN, Cu, a Mo alloy, an Al alloy and a Cu alloy.

The polycrystalline silicon layer 160 and the doped amorphous silicon layer 170 are patterned using one mask in the present embodiment, however, the polycrystalline silicon layer 160 and the metal layer for source and drain electrodes may be patterned using one mask when the doped amorphous silicon layer 170 is not formed.

Figure 5:
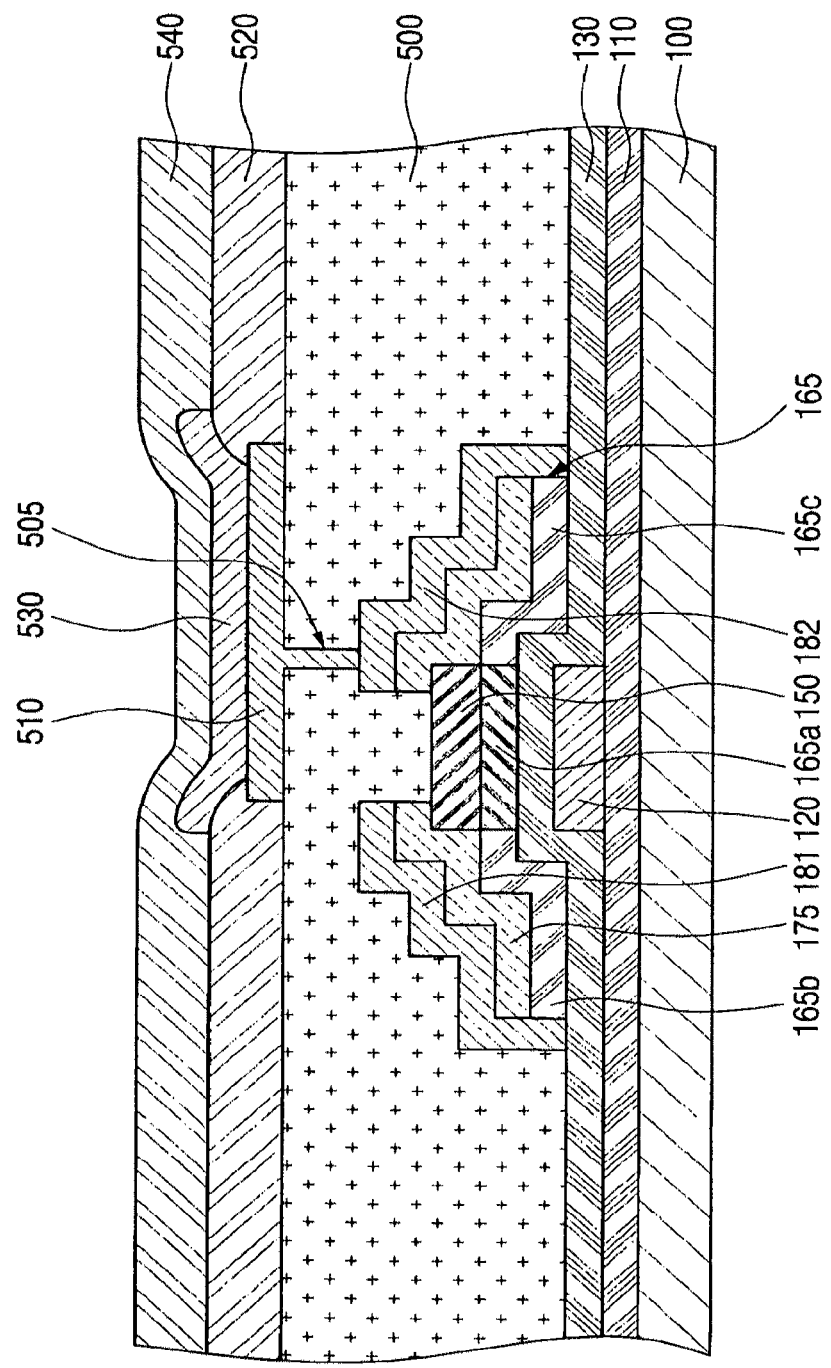
FIG. 5 is a cross-sectional view of an organic light emitting diode (OLED) display device including a thin film transistor (TFT) in accordance with an embodiment of the present invention.

FIG. 5 is a cross-sectional view of an organic light emitting diode (OLED) display device including a thin film transistor (TFT) in accordance with an embodiment of the present invention.

Referring to FIG. 5, an insulating layer 500 is formed on the entire surface of the substrate 100 including a thin film transistor (TFT) according to an embodiment of the present invention. The insulating layer 500 may be formed of one selected from inorganic layers consisting of a silicon oxide layer, a silicon nitride layer and a silicon-on-glass or one selected from organic layers consisting of polyimide, benzocyclobutene series resin and acrylate. In addition, the insulating layer may be formed in a stacked structure of the inorganic and organic layers.

The insulating layer 500 is etched to form a via hole 505 exposing the drain electrode 182 (or the source electrode 181). A first electrode 510 is formed to be connected to any one of the source and drain electrodes 181 and 182 through the via hole 505. The first electrode 510 may be an anode or a cathode. When the first electrode 510 is an anode, the anode may be formed of a transparent conductive layer made of one of indium tin oxide (ITO), indium zinc oxide (IZO) and indium tin zinc oxide (ITZO). When the first electrode is a cathode, the cathode may be formed of Mg, Ca, Al, Ag, Ba or an alloy thereof.

A pixel defining layer 520 having an opening for exposing a portion of a surface of the first electrode 510 is then formed on the first electrode 510, and an organic layer 530 including an emitting layer is formed on the exposed first electrode 510. The organic layer 530 may further include at least one selected from the group consisting of a hole injection layer, a hole transport layer, a hole blocking layer, an electron blocking layer, an electron injection layer and an electron transport layer. A second electrode 540 is then formed on the organic layer 530. The second electrode 540 is a cathode when the first electrode 510 is an anode, and is an anode when the first electrode 510 is a cathode.

According to the present invention, there are provided a thin film transistor (TFT), a method of fabricating the same, and an OLED display device including the same which can increase the size of a grain in a channel region, effectively protect the channel region of a semiconductor layer at the time of etching process, and reduce processing cost by forming an etch stop layer pattern and crystallizing an amorphous silicon layer using a continuous-wave solid-state laser.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A thin film transistor (TFT) comprising:
a substrate;
a gate electrode disposed on the substrate;
a gate insulating layer disposed on the gate electrode;
a polycrystalline silicon layer comprising a semiconductor layer pattern disposed on the gate insulating layer and including a channel region, a source region and a drain region;
an etch stop layer pattern disposed on the channel region of the semiconductor layer pattern and having a thickness of 20 to 60 nm, wherein a size of a grain forming the channel region of the semiconductor layer pattern is 1 to 10 µm, and a size of a grain forming the source and drain regions is 0.5 to 2 µm;
an amorphous silicon layer pattern doped with n or p-type impurities disposed on the source and drain regions of the semiconductor layer pattern; and
source and drain electrodes disposed on the amorphous silicon layer pattern on the source and drain regions of the semiconductor layer pattern, respectively.

2. The thin film transistor (TFT) according to claim 1, wherein the etch stop layer pattern has a thickness of 40 to 60 nm.

3. The thin film transistor (TFT) according to claim 1, wherein a grain boundary is not present in the channel region.

4. The thin film transistor (TFT) according to claim 1, wherein a grain in the channel region of the semiconductor layer grows in a direction parallel with a line connecting the source region and the drain region.

5. The thin film transistor (TFT) according to claim 1, wherein the etch stop layer pattern is formed of a silicon nitride layer or a silicon oxide layer.

6. The thin film transistor (TFT) according to claim 1, wherein the etch stop layer pattern has an etch selectivity of 0 to 1 nm/minute with respect to a solution in which $NH_4F$ and HF are mixed at a ratio of 6:1.

7. The thin film transistor (TFT) according to claim 1, further comprising:
the amorphous silicon layer pattern and the source and drain electrodes partially overlapping the etch stop.

8. An organic light emitting diode (OLED) display device comprising:
a substrate;
a gate electrode disposed on the substrate;
a gate insulating layer disposed on the gate electrode;
a polycrystalline silicon layer comprising a semiconductor layer pattern disposed on the gate insulating layer and including a channel region, a source region and a drain region;
an etch stop layer pattern disposed on the channel region of the semiconductor layer pattern and having a thickness of 20 to 60 nm, wherein a size of a grain forming the channel region of the semiconductor layer pattern is 1 to 10 µm, and a size of a grain forming the source and drain regions is 0.5 to 2 µm;
an amorphous silicon layer doped with n or p-type impurities disposed on the source and drain regions of the polycrystalline silicon layer;
source and drain electrodes disposed on the amorphous silicon layer and electrically contacting the source and drain regions of the semiconductor layer pattern;
a first electrode electrically connected to one of the source and drain electrodes;
an organic layer disposed on the first electrode and including an emission layer; and
a second electrode disposed on the organic layer.

9. A method of fabricating a thin film transistor, comprising:
preparing a substrate;
forming a gate electrode on the substrate;
forming a gate insulating layer on the gate electrode;
forming an amorphous silicon layer on the gate insulating layer;
forming an etch stop layer pattern to a thickness of 20 to 60 nm on a predetermined region of the amorphous silicon layer;
irradiating a laser on the entire surface of the substrate to crystallize the amorphous silicon layer to form a polycrystalline silicon layer including a channel region, a source region and a drain region, a size of a grain forming the channel region of the semiconductor layer pattern being 1 to 10 μm, and a size of a grain forming the source and drain regions being 0.5 to 2 μm;

forming an amorphous silicon layer doped with n or p-type impurities on the entire surface of the substrate where the etch stop layer pattern is formed after forming the polycrystalline silicon layer, and patterning the polycrystalline silicon layer and the amorphous silicon layer doped with n or p-type impurities;

forming a metal layer for source and drain electrodes on the entire surface of the substrate where the etch stop layer pattern is formed; and patterning the metal layer to form source and drain electrodes electrically connected to the source and drain regions.

10. The method according to claim 9, wherein the laser is a continuous-wave solid-state laser.

11. The method according to claim 10, wherein the continuous-wave solid-state laser uses Nd:YVO$_4$ (Yttrium Vanadate) as a solid source, and is a continuous-wave solid-state green laser having a wavelength of 500 to 550 nm.

12. The method according to claim 10, wherein the continuous-wave solid-state laser is irradiated in a direction parallel to a line connecting the source region and the drain region of the semiconductor layer.

13. The method according to claim 9, wherein the patterning of the polycrystalline silicon layer and the metal layer to form source and drain electrodes comprises patterning using one mask.

14. The method according to claim 9, wherein when the laser is irradiated on the entire surface of the substrate to crystallize the amorphous silicon layer, a temperature of the amorphous silicon layer corresponding to a region where the etch stop layer pattern is formed is higher than a temperature of the amorphous silicon layer corresponding to a region where the etch stop layer pattern is not formed.

15. The method according to claim 9, wherein the etch stop layer pattern irradiated with the laser has an etch selectivity of 0 to 1 nm/minute with respect to an etching solution in which NH$_4$F and HF are mixed at a ratio of 6:1.

16. The method according to claim 9, wherein the patterning of the polycrystalline silicon layer and the amorphous silicon layer doped with n or p-type impurities comprises patterning using one mask.

17. A thin film transistor (TFT) manufactured by the method of claim 9, comprised of:

the substrate;

the gate electrode being disposed on the substrate;

the gate insulating layer being disposed on the gate electrode;

the polycrystalline silicon layer comprising a semiconductor layer pattern disposed on the gate insulating layer and including the channel region, the source region and the drain region;

the etch stop layer pattern being disposed on the channel region of the semiconductor layer pattern;

the amorphous silicon layer doped with n or p-type impurities disposed on the source and drain regions of the polycrystalline silicon layer; and the source and drain electrodes being respectively disposed on the source and drain regions of the semiconductor layer pattern.

* * * * *